US012699118B2

(12) United States Patent　　　(10) Patent No.:　　US 12,699,118 B2

Ahmed　　　　　　　　　　　　　　(45) Date of Patent:　　　　Aug. 4, 2026

(54) DETECTION OF DEVICE DISPLACEMENT BASED ON MONITORING CURRENT OR POWER CONSUMPTION

(71) Applicant: DISH Network Technologies India Private Limited, Bangalore (IN)

(72) Inventor: Mansoor Ahmed, Bengaluru (IN)

(73) Assignee: DISH NETWORK TECHNOLOGIES INDIA PRIVATE LIMITED, Bangalore (IN)

( * ) Notice: Subject to any disclaimer, the term of this patent is extended or adjusted under 35 U.S.C. 154(b) by 208 days.

(21) Appl. No.: 18/393,452

(22) Filed: Dec. 21, 2023

(65) Prior Publication Data

US 2025/0208176 A1　　Jun. 26, 2025

(51) Int. Cl.
*G01R 19/165*　　　(2006.01)

(52) U.S. Cl.
CPC .................................. *G01R 19/165* (2013.01)

(58) Field of Classification Search
CPC .............................. G01R 19/00; G01R 19/165
USPC ........................................................ 324/71.1
See application file for complete search history.

(56) References Cited

U.S. PATENT DOCUMENTS

| | | | | |
|---|---|---|---|---|
| 12,427,641 B2 * | 9/2025 | Cox | .................. | H01M 10/4207 |
| 12,459,453 B2 * | 11/2025 | Kinoshita | ............... | B60R 16/03 |
| 2011/0264297 A1 * | 10/2011 | Nakano | ................... | H02J 50/12 |
| | | | | 700/297 |
| 2013/0300348 A1 * | 11/2013 | Schwartz | .................. | H02J 5/00 |
| | | | | 320/162 |

FOREIGN PATENT DOCUMENTS

| | | | | | |
|---|---|---|---|---|---|
| CN | 103491220 | A | * | 1/2014 | .............. H04M 1/24 |
| CN | 206041142 | U | * | 3/2017 | ........... H01R 13/717 |
| CN | 109949526 | A | * | 6/2019 | ........... G08B 13/181 |
| EP | 1107120 | A1 | * | 6/2001 | .............. H04B 1/40 |
| GB | 2635355 | A | * | 5/2025 | ........... H02J 7/0045 |
| JP | 2002335307 | A | * | 11/2002 | .............. H04M 1/00 |
| JP | 4815560 | B2 | * | 11/2011 | ........ H04W 52/0296 |

* cited by examiner

*Primary Examiner* — Hoai-An D. Nguyen

(74) *Attorney, Agent, or Firm* — Seed Intellectual Property Law Group LLP

(57) ABSTRACT

Techniques for detecting displacement of a device are provided. A displacement detection device measures a current flowing through a wire and determines a first current measurement. The displacement detection device determines that the first current measurement is less than a threshold and in response to determining that the first current measurement is less than the threshold, transmits data to a server indicating that a device that was being supplied with power using the wire has been displaced.

17 Claims, 6 Drawing Sheets

300

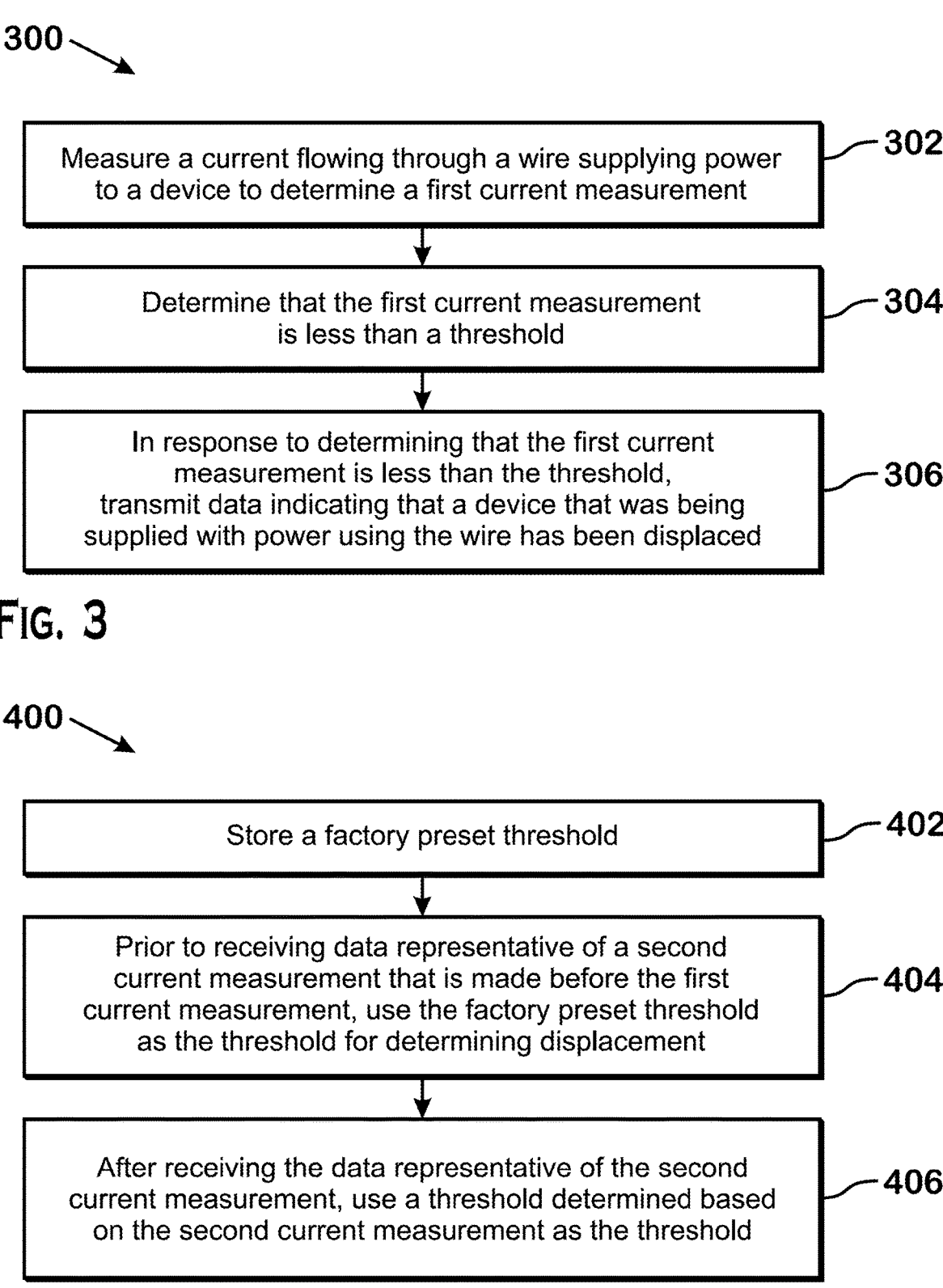

| | |
|---|---|
| Measure a current flowing through a wire supplying power to a device to determine a first current measurement | 302 |
| Determine that the first current measurement is less than a threshold | 304 |
| In response to determining that the first current measurement is less than the threshold, transmit data indicating that a device that was being supplied with power using the wire has been displaced | 306 |

| | |
|---|---|
| Store a factory preset threshold | 402 |
| Prior to receiving data representative of a second current measurement that is made before the first current measurement, use the factory preset threshold as the threshold for determining displacement | 404 |
| After receiving the data representative of the second current measurement, use a threshold determined based on the second current measurement as the threshold | 406 |

FIG. 4

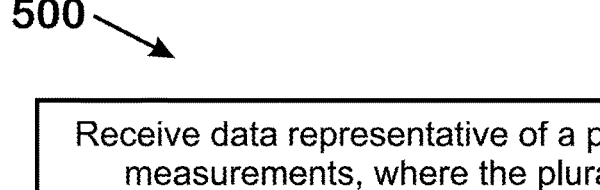

500

| |
|---|
| Receive data representative of a plurality of second current measurements, where the plurality of second current measurements includes a first set of current measurements made when the streaming device is operating in an active mode and a second set of current measurements made when the streaming device is operating in a standby mode |

— 502

↓

| |
|---|
| Identify the second set of current measurements out of the plurality of second current measurements |

— 504

↓

| |
|---|
| Set the threshold based on the second set of current measurements pertaining to the standby mode cluster |

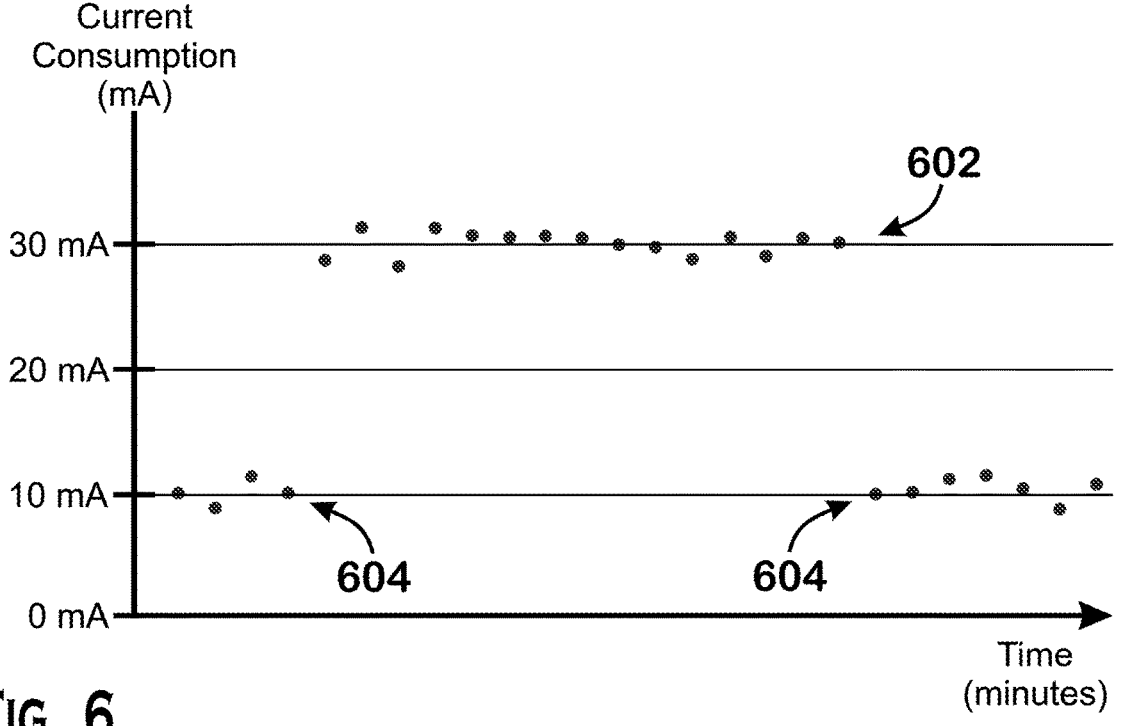

DETECTION OF DEVICE DISPLACEMENT BASED ON MONITORING CURRENT OR POWER CONSUMPTION

BACKGROUND

Devices, including streaming devices, phones, projectors, tablets, point of sale (POS) payment terminals or barcode scanners, are often used in public places, such as public schools, or private places providing public accommodation, such as hotels or conference centers. The devices may be used to enable multimedia audiovisual display of content. For example, a device may be used to stream content to a hotel room television or project images in a meeting of a conference center. The devices are subject to displacement by persons utilizing the services provided by the places.

BRIEF SUMMARY

Provided is a displacement detection device. The displacement detection device detects whether another device, such as a streaming device or projector, has been displaced. In particular, the streaming device may consume electrical power during operation. When displaced, the streaming device is disconnected or unplugged from electrical power and is relocated. The displacement detection device monitors the electrical power drawn by the streaming device. Due to the fact that current consumption reflects power use, the displacement detection device may monitor the current consumption of the streaming device. The displacement detection device sends an alert when the electrical power drawn by the streaming device decreases to a level that suggests that the streaming device has been unplugged from a power source. The alert may be received by a server, and the server may use the alert to inform facility staff that the streaming device is displaced. In the event that the streaming device is used in a private place providing a public accommodation, the server may impose a fine or a fee to an account associated with the accommodation.

BRIEF DESCRIPTION OF THE DRAWINGS

FIG. 3 shows a flow diagram of a method for detecting displacement of a streaming device.

FIG. 4 shows a flow diagram of a method for setting a current threshold for detecting displacement of the streaming device.

FIG. 5 shows a flow diagram of a method for setting a current threshold for detecting displacement of a streaming device.

FIG. 6 shows an example of active mode and standby mode current measurement clusters.

DETAILED DESCRIPTION

Figure 1:
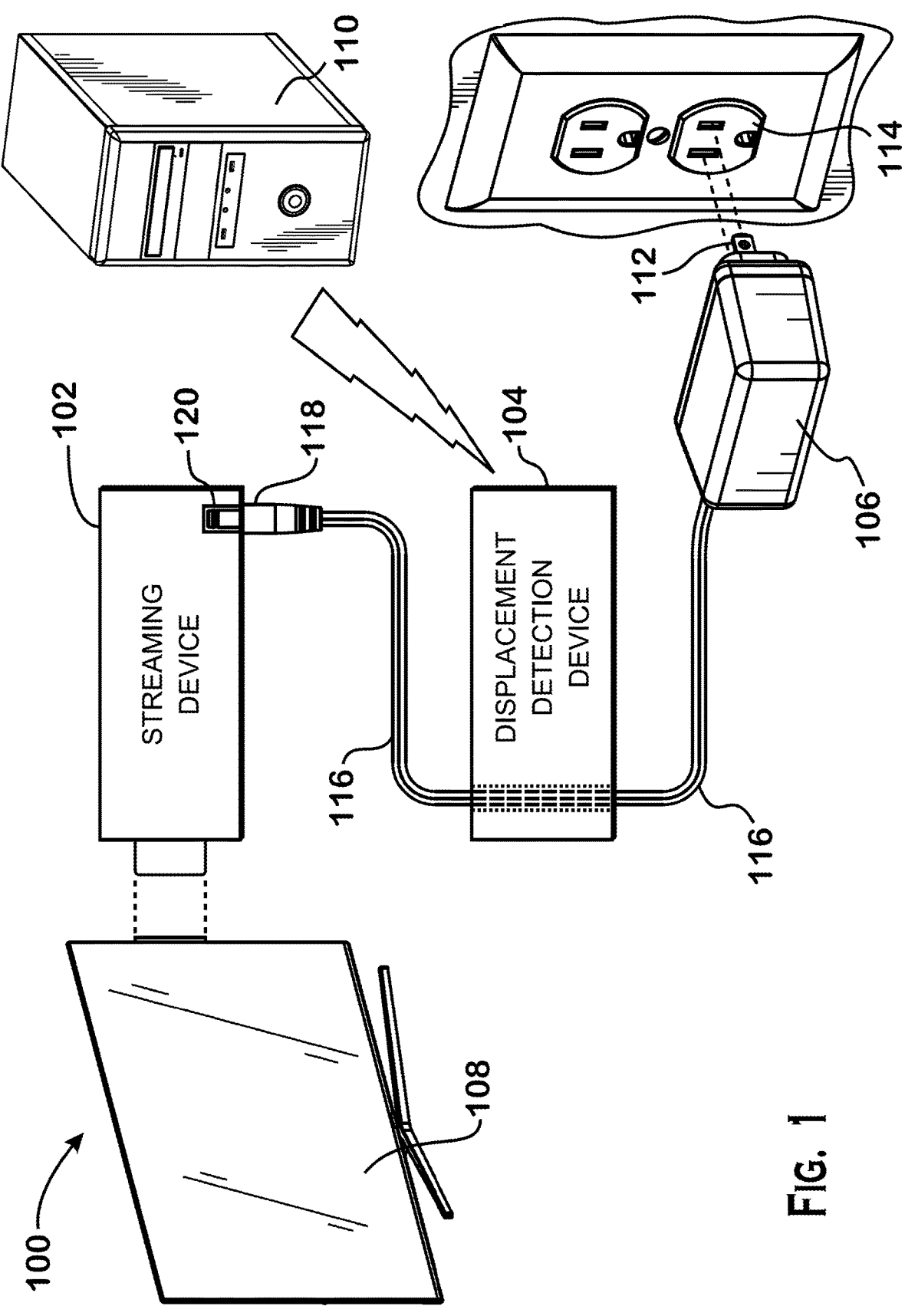
FIG. 1 shows a system for detecting a displacement of a streaming device.

FIG. 1 shows a system 100 for detecting a displacement of a streaming device 102. The system 100 includes the streaming device 102, a displacement detection device 104, a power adapter 106, a television 108 and a backend server 110.

The power adapter 106 may include an alternating current (AC) to direct current (DC) converter (AC-DC converter) and a plug 112. The plug 112 is operative to combine with (or to be plugged into) a socket 114. The power adapter 106 may draw AC power from the socket 114 and convert the AC power to DC power using the AC-DC converter. The power adapter 106 is coupled to the displacement detection device 104 using a wire 116. The power adapter 106 provides the DC power over the wire 116 for powering the streaming device 102.

The displacement detection device 104 detects (or monitors) current or power that flows over the wire 116. The displacement detection device 104 determines whether the streaming device 102 has been displaced based on detecting the current or power. The displacement detection device 104 communicates with the backend server 110. The displacement detection device 104 sends to the backend server 110 data indicating whether the streaming device 102 has been displaced.

The wire 116 is coupled to a connector 118. The connector 118 may be any power connector. The connector 118 may be a universal serial bus (USB) connector, such as, a USB-A connector or a USB-C connector. The connector 118 may be received in a corresponding socket 120 of the streaming device 102. The streaming device 102 may include the socket 120 that mates with the connector 118. For example, if the connector 118 is a USB-C connector, then the socket 120 is a USB-C socket.

The streaming device 102 may stream media content for display or play on the television 108. The streaming device 102 may send data representative of the media content to the television 108. The data may be video, audio or audiovisual data. The streaming device 102 includes a communication device, which may be a Wi-Fi modem. The streaming device 102 streams the media content (e.g., from the internet) using the communication device. The streaming device 102 may process the streamed media content (e.g., by encoding or decoding the media content). The streaming device 102 may also buffer the media content or a portion thereof. The streaming device 102 may send the data representative of the media content to the television 108.

The streaming device 102 includes a communication interface 122. The communication interface 122 may be a High-Definition Multimedia Interface (HDMI), an optical interface, a Digital Visual Interface (DVI), a DisplayPort (DP) interface or a Video Graphics Array (VGA) interface, among others. The streaming device 102 may be connected to the television 108 using the communication interface 122. For example, the streaming device 102 may be connected to the television 108 via an HDMI connection. The streaming device 102 sends the data representative of the media content to the television 108 for display or play on the television 108.

The backend server 110 may access data stored in memory (e.g., of the backend server 110). The backend server 110 may write and save data in the memory or retrieve data stored in the memory. The data may be in a tabular form and may associate streaming devices with respective indications of whether the streaming device has been displaced. The streaming device may be identified using a unique identity of the streaming device, which may be an identity of a location (e.g., conference room number) of where the streaming device was used. For example, for various rooms in a hotel facility, the backend server 110 may associate each room with an indication of whether the streaming device in the room has been displaced.

The backend server 110 receives, from the displacement detection device 104, the data indicating whether the streaming device 102 has been displaced. In response to receiving data indicating that the streaming device 102 has been displaced, the backend server 110 writes to the memory and associates the streaming device 102 with an indication that the streaming device 102 has been displaced. The backend server 110 may also output an alarm (e.g., to hotel staff) indicating that the streaming device 102 has been displaced. The alarm may be displaced on a screen of the server. The backend server 110 may generate invoices for various hotel rooms in a facility. The server may associate a streaming device with a fec. If the server receives data indicating that the streaming device 102 has been displaced, the server may apply a fee associated with the loss of the streaming device 102 to an account of an entity using the facility. As described herein, the identity associated with the streaming device 102 may be a room identity. Accordingly, the server may readily identify the room whose invoice is to include the fee. Alternatively, the server may maintain a list of associating streaming device identities with respective hotel rooms and the server may consult the list to determine the room or guest that is to be charged a streaming device fec.

Figure 2:
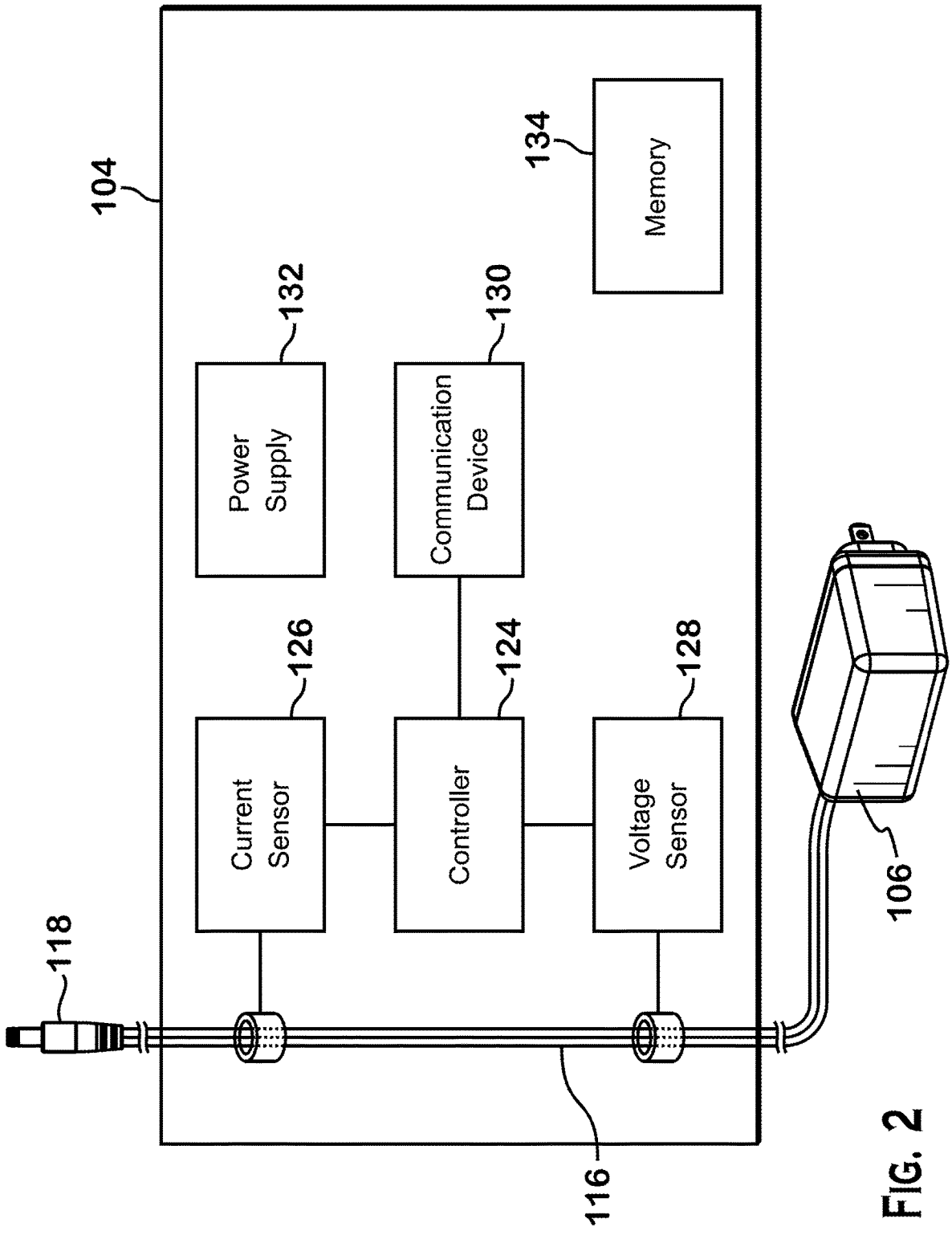
FIG. 2 shows a block diagram of the displacement detection device.

FIG. 2 shows a block diagram of the displacement detection device. The displacement detection device 104 includes a controller 124, a current sensor 126, a voltage sensor 128, a communication device 130, a power supply 132 and memory 134.

The controller 124 may be a computing unit configured to perform the techniques described herein. The controller 124 may be a processor, microprocessor or microcontroller. The controller 124 may be equipped with a processing core, a central processing unit (CPU), a graphics processing unit (GPU), an arithmetic and logic unit (ALU) or a combination thereof, which gives the controller 124 the computational capability to perform the techniques described herein.

The current sensor 126, which may be an ammeter, is coupled to the controller 124. For example, the current sensor 126 may be a Hall effect sensor. The current sensor 126 may be connected to the wire 116 or, as in the case of the Hall effect sensor, positioned proximate to the wire 116. The current sensor 126 may detect a current flowing through the wire 116 and output data representative of the current to the controller 124.

The voltage sensor 128, which may be a voltmeter, is coupled to the controller 124. The voltage sensor 128 may be connected to the wire or positioned proximate to the wire 116. The voltage sensor 128 may detect a voltage of the wire 116 and output data representative of the voltage to the controller 124. The voltage sensor 128 may include a resistance (e.g., of a small size) and an amplifier. The current passing through the wire 116 may be passed through the resistance. The amplifier may have a first input coupled to a first terminal of the resistance and a second input coupled to a second terminal of the resistance. The amplifier may determine a voltage of the wire based on the voltage drop across the resistance.

The controller 124 may detect the displacement of the streaming device 102 based on the power supplied by the wire 116 or the current flowing through the wire 116. The controller 124 may determine the power from both the current and voltage measurements. However, in the event that the controller 124 determines displacement based on current measurement alone, use of the voltage sensor 128 (to make a voltage measurement) may be forgone or the displacement detection device 104 may not include the voltage sensor 128.

The communication device 130 may be a transceiver, modem or radio module. The communication device 130 is coupled to the controller 124. The communication device 130 may communicate in accordance with any protocol, such an Institute for Electrical and Electronics Engineers (IEEE) 802 protocol, a near field communications (NFC) protocol, a Bluetooth protocol or a combination thereof.

The power supply 152 may be a power converter, a battery or a combination thereof. The power converter may be coupled to the wire and may draw power therefrom for supplying the displacement detection device 104 and for charging the battery, which may be a rechargeable battery. In the event that the power adapter 106 is unplugged from the socket 114 (and power may not be drawn from the wire 116), the power supply 152 may supply power to the displacement detection device 104 from the battery. The displacement detection device 104 may use the battery-supplied power to operate and send data indicating whether the streaming device 102 has been displaced. With the use of the battery, the displacement detection device 104 may still operate even when the streaming device 102 is unplugged from power.

The memory 134 may be a data storage device that is configured to store executable instructions that, when executed by the controller 124, cause the controller 124 to perform the techniques described herein. The memory 134 may be read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, or solid state memory devices or a combination thereof. The memory 134 may also store the current or power threshold described herein.

It is noted that although the displacement detection device 104 is shown to be in a separate housing than the streaming device 102 or the power adapter 106, the displacement detection device 104 may be part of the streaming device 102 or the power adapter 106. For example, the displacement detection device 104 may be part of the power adapter 106 or the housing thereof, and the power adapter 106 may detect the unplugging of the connector 118 or displacement of the streaming device 102. Alternatively, the displacement detection device 104 may be part of the streaming device 102 or the housing thereof, and the streaming device 102 may detect the unplugging of the connector 118 or displacement of the streaming device 102 using the techniques described herein. It is noted that if the displacement detection device 104 is part of the streaming device 102 or the housing thereof, the displacement detection device 104 monitors current flow or power consumption on internal lines of the streaming device 102 (rather than the wire coupling the power adapter 106 to the streaming device 102).

FIG. 3 shows a flow diagram of a method 300 for detecting displacement of a streaming device. Even though a streaming device is described, the techniques described herein may be used for any device that is powered by a power source (such as, a voltage converter) and susceptible to theft or displacement, whereby the theft or displacement of which cuts off the supply of power to the device. As described herein, the device may be a streaming device used in a hotel room or a public place for streaming content to a television. Displacement of the streaming device may include unplugging the device from a wired power source as to enable transporting the device to another location (outside of the room).

In the method 300, a displacement detection device, such as the displacement detection device 104 described with reference to FIG. 2 herein, or a current sensor thereof, at 302, measures a current flowing through the wire supplying power to the streaming device to determine a first current measurement. The current sensor may output data representative of the first current measurement to a controller of the displacement detection device and the controller may receive the data for determining whether the streaming device has been displaced.

At 304, the displacement detection device determines that the first current measurement is less than a threshold. The threshold may be a level of current below which a determination may be made that the streaming device is removed from power and, thus, may potentially be stolen. The threshold may be set to a level that is below a typical (or expected) current consumption of the streaming device. Thus, displacement may be detected when the current consumption drops to a level that is lower than the typical current consumption. The threshold is set to a level that is lower than the typical current consumption so as to minimize the occurrence of false positives. For example, if during an active mode in which the streaming device streams content for display on a television, the current consumption of the streaming device is 30 milliamperes (mA) and during a standby mode in which the device does not stream content, the device consumes 10 mA, then the current threshold may be set to 5 mA (or half of the typical current consumption in standby mode).

At 306, the displacement detection device, in response to determining that the first current measurement is less than the threshold, transmits data indicating that the streaming device that was being supplied with power using the wire has been displaced. The displacement detection device may transmit the data to a server. A communication device, such as a Wi-Fi radio, of the displacement detection device may transmit the data. The data may include an identifier associated with the streaming device. For example, the identifier may be a manufacturer identifier of the streaming device or identify a location of the streaming device, such as a hotel room number if the streaming device is used in hospitality services or a classroom identifier if the streaming device is used in educational services. Alternatively, the identifier may be an identifier of the displacement detection device.

In one embodiment, the system can also detect whether the current is above a selected threshold. There could be two thresholds set, a high threshold and a low threshold. The high threshold will be at a value above any expected current flow in the device. For example, if standard full power operating current is 30 milliamperes (mA), the maximum expected current is 40 mA and the maximum rated current is 45 mA, a high threshold current at 50 mA can be set. This high threshold current of 50 mA might be exceed if there is a malfunction or fault in the device. An alert can be sent to the server if the high threshold is exceeded and, if it is excessively high current flow, steps can be taken to stop the current flow to avoid overheating, a damage to the device, a fire or other problems. In addition, if the device is removed and replaced with a different device that has a higher power consumption. A user might remove the device and replace it with their own, that operates at higher power, and this will be detected as well. The steps taken and alert being sent for the high threshold being exceed will be the same as for the current below the low threshold and it is not repeated here to avoid repetition.

As stated herein, the displacement detection device 104 detects (or monitors) current or power that flows over the wire 116. The displacement detection device 104 determines whether the streaming device 102 has been displaced or is defective based on detecting the current or power. In those embodiments in which a high threshold is set, the displacement detection device 104 will detect that either the device 102 has been replaced by a different device drawing higher power or is defective, for example, because of a fault is drawing an excessive amount of current. Throughout this specification, all references to the device 102 being displaced based on detecting a current below a threshold that is a low threshold can be applied in the same way to detecting a current is detected above the high threshold and the same steps can be taken as a result of such detection. For example, the displacement detection device 104 sends to the backend server 110 data indicating that the high threshold has been exceeded for the streaming device 102 and thus there is a fault, either by it being displaced, replaced, a different device being put it is place, a malfunction in the current device or the like.

FIG. 4 shows a flow diagram of a method 400 for setting a current threshold for detecting displacement of a streaming device. In the method 400, the displacement detection device stores a factory preset threshold at 402. For example, a manufacturer of the displacement detection device may set the threshold in accordance with the known current consumption of a streaming device for which the displacement detection device is used to determine displacement or the current consumption of a class of streaming devices for which the displacement detection device is used to determine displacement.

The displacement detection device, at 404, prior to receiving data representative of a second current measurement that is made before the first current measurement, uses the factory preset threshold as the threshold for determining displacement. During initial operation (and before the displacement detection device makes one or more current measurements that enable threshold adjustment), the displacement detection device uses the factory preset threshold for displacement determination. The displacement detection device may adjust the factory preset threshold according to the current consumption observed during use of the streaming device. The displacement detection device may increase or decrease the threshold depending on the current measurements that are made. The current measurements made by the displacement detection device may account for variability in the system 100.

The displacement detection device, at 406, after receiving the data representative of the second current measurement, uses a threshold determined based on the second current measurement as the threshold. The displacement detection device obtains one or more current measurements of the consumption of the streaming device. The displacement detection device sets the threshold based on the one or more current measurements. The displacement detection device may determine that the one or more current measurements were made when the streaming device that was being supplied with power using the wire. Accordingly, the one or more current measurements are reflective of a current consumption of the streaming device. Accordingly, the displacement detection device may set the threshold to a value that is less than the current measurement or less so as to reduce false positives in displacement detection.

The displacement detection device may determine that the second current measurement is greater than 0 Amperes (A), and in response to determining that the second current measurement is greater than OA, the displacement detection device may determine that the second current measurement was made when the streaming device that was being supplied with power using the wire and is reflective of a current consumption of the streaming device.

FIG. 5 shows a flow diagram of a method 500 for setting a current threshold for detecting displacement of a streaming device. In the method 500, the displacement detection device, at 502, receives data representative of a plurality of second current measurements, where the plurality of second current measurements including a first set of current measurements made when the streaming device is operating in an active mode and a second set of current measurements made when the streaming device is operating in a standby mode. The controller 124 may receive the data representative of the second current measurements from the current sensor 126. The streaming device may operate in multiple modes. For example, the streaming device may operate in a standby mode in which the streaming device does not receive media content or decode the media content for presentation on the television 108. In the standby mode, the streaming device may be powered and consuming power received from the adapter 106 and the streaming device may be standing by to receive user command to stream content, but the streaming device may not be actively streaming content in the standby mode. The streaming device may operate in an active mode in which the streaming device streams content. Power (and current) consumption may be lower in the standby mode than the active mode. The displacement detection device may determine the threshold based on the standby mode power (or current) consumption rather than the active mode power (or current) consumption.

The displacement detection device, at 504, identifies the second set of current measurements out of the plurality of second current measurements. The displacement detection device may identify the second set of current measurements based on determining that the second set of current measurements form a cluster pertaining to the standby mode that is distinct from a cluster of the first set of current measurements.

FIG. 6 shows an example of active mode and standby mode current measurement clusters 602, 604. Current measurements for the streaming device are shown in milliamperes over time. During active mode, the current consumption measurements are about 30 mA, and current measurement values vary and cluster around 30 mA. The current consumption measurements are about 10 mA during standby mode, and current measurement values vary and cluster around 10 mA when the streaming device is in a standby mode. The displacement detection device distinguishes between current measurements that belong to the active mode cluster 602 and the standby mode cluster 604 and uses one or more values of the standby mode cluster 604 for determining the threshold. The displacement detection device may determine the cluster 602, 604 to which a current measurement belongs using a hierarchical clustering technique or a k-means algorithm, among others.

Referring back to FIG. 5, the displacement detection device, at 506, sets the threshold based on the second set of current measurements pertaining to the standby mode cluster 604. The displacement detection device forgoes using active mode current measurements for threshold determination. The displacement detection device sets the threshold based on standby mode current measurements.

If the second set includes more than one measurement, the displacement detection device sets the threshold based on a mean, median, mode or minimum of the second set of current measurements. For example, the displacement detection device may set the threshold to be 50% of the mean current measurement of the standby mode measurements.

The displacement detection device (or current sensor thereof) may periodically (for example, every minute or five minutes) measure the current flowing through the wire 116. The displacement detection device may compare each of the measurements to the threshold to determine whether the streaming device is displaced. The displacement detection device may report to the server whether or not the streaming device is displaced. Accordingly, the displacement detection device may report a "pulse" to the server indicating whether the streaming device remains plugged and is drawing power or has been unplugged and displaced from power supply.

Described herein are technique for determining that a device has been displaced based on current flow. The displacement may additionally or alternatively be detected based on power consumption of the streaming device 102. Power is the product of current and voltage, and current flow is indicative of power consumption. The techniques described herein with reference to current measurement may be used for determining displacement based on power measurement. In the event that the displacement detection device 104 detects displacement based on a power measurement, the displacement detection device 104 is equipped with the current sensor 126 and the voltage sensor 128 (or alternatively, a power meter). The displacement detection device 104 (or controller 124 thereof) may determine the power as a product of a current measurement made by the current sensor 126 and a voltage measurement made by the voltage sensor 128. The displacement detection device 104 (or controller 124 thereof) may use the same techniques described herein with reference to current measurement for displacement determination based on power measurement. For example, the displacement detection device 104 may be equipped with a preset factory power threshold and may update the threshold based on power measurements made while the streaming device 102 is in use. The displacement detection device 104 may compare one or more power measurements to the power threshold to determine whether the device is displaced.

The displacement detection device 104 may make instantaneous power measurements. Accordingly, the displacement detection device 104 may ensure that a current measurement used for power determination corresponds to a voltage measurement. The two measurements may corresponds to each other if they are taken at the same time or within a brief interval of time from each other (for example, within half a second of each other) or if they are received by the controller 124 at the same time or within the brief interval of time from each other. The two measurements may not be far apart from each other in time such that their product does not reflect an instantaneous power measurement of the wire 116. The displacement detection device 104 may command the current and voltage sensors 126, 128 to make measurements at the same time (or within half a second of each other) and may obtain the product of the measurements that are made to determine a power measurement. When one or more power measurements are obtained, the displacement detection device 104 uses the techniques described herein in relation to current measurement(s) to determine displacement based on power measurement(s).

It is noted that the technique described herein in relation to a streaming device may be used to determine the displacement of any device, such as a phone, tablet, point of sale (POS) payment terminal or barcode scanner. The device may be powered by a wired connection. The displacement detection device 104 may be positioned to detect current flow or power consumption over the wire, and the displacement detection device 104 may determine whether the device has been unplugged and displaced and set a detection threshold as described herein.

In an embodiment tagging may be used to detect device displacement. For example, a device may have a tag, which may be a Bluetooth tag or a radio-frequency identification (RFID) tag, attached thereto. A set top box may detect displacement of the device based on the distance between the tag and the set top box.

Figure 7:
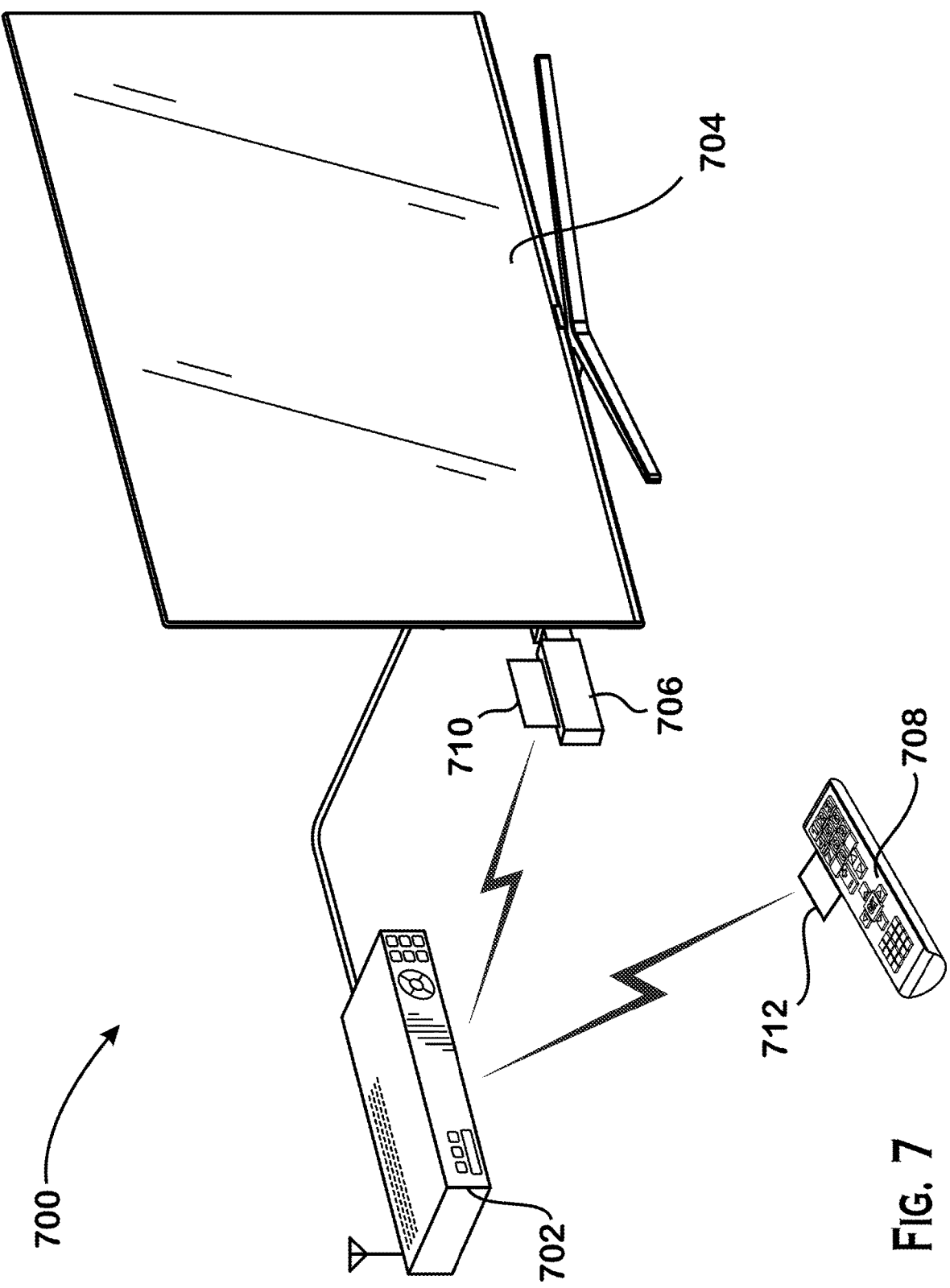
FIG. 7 shows a system in which device displacement is detected based on tag distance.

FIG. 7 shows a system 700 in which device displacement is detected based on tag distance. The system 700 includes a set top box 702, television 704, streaming device 706 and remote control 708. The streaming device 706 has a first tag 710 attached thereto, and the remote control 708 has a second tag 712 attached thereto. The first and second tags 710, 712 may each be a Bluetooth tag or an RFID tag. The set top box 702 may have a transceiver that is compliant with the communication protocol of the tags 710, 712. The set top box 702 may determine the distance between the transceiver and a tag 710, 712 based on a received signal strength (RSS) of a signal emanating from the tag 710, 712. The set top box 702 may determine whether the device to which the tag 710, 712 is attached has been displaced based on the distance. As described herein, the set top box 702 may send data to a server indicating whether the device has been displaced.

Figure 8:
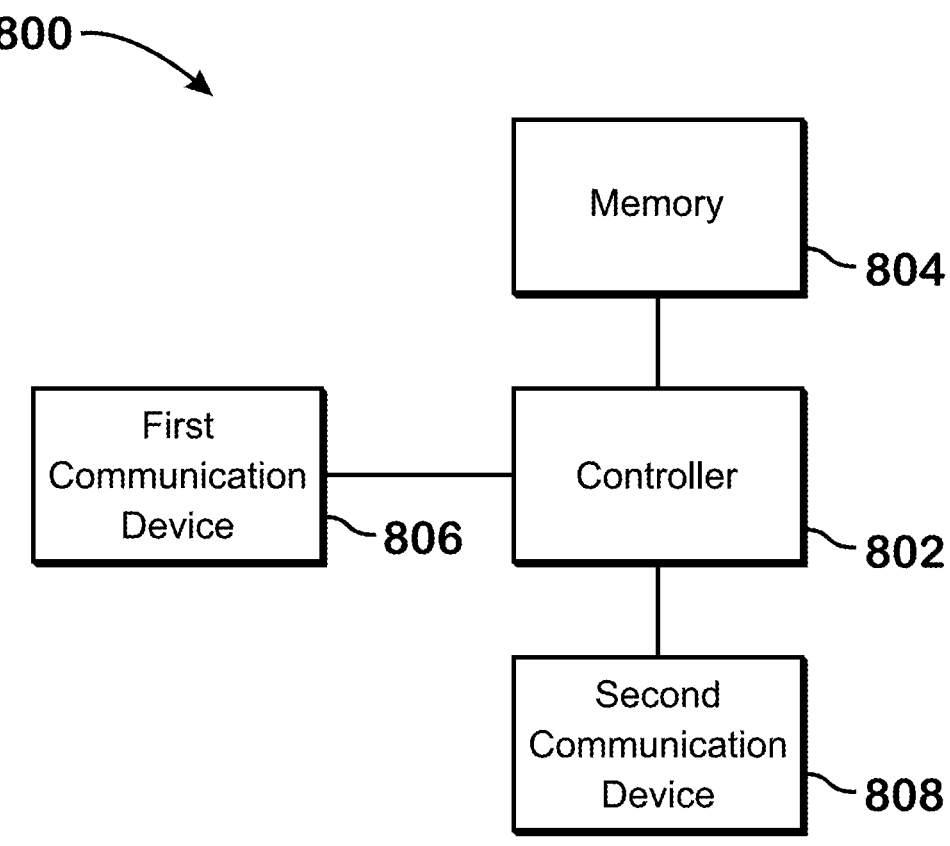
FIG. 8 shows a block diagram of a set top box.

FIG. 8 shows a block diagram of a set top box 800. The set top box 800 includes a controller 802, memory 804 and first and second communication devices 806, 808. It is noted that the set top box 800 also includes a multimedia pipeline that is not shown in FIG. 8. The multimedia pipeline may include one or more transceivers, an encoder, a decoder or a combination thereof. The multimedia pipeline may receive media content (e.g., from the internet), process the media content (e.g., by encoding, decoding or buffering the media content) and send data representative of the media content to the television 704 (e.g., over an HDMI interface) for display on the television 704.

The controller 802 may be a computing unit configured to perform the techniques described herein in relation to the set top box. The controller 802 may be a processor, microprocessor or microcontroller. The controller 802 may be equipped with a processing core, a central processing unit (CPU), a graphics processing unit (GPU), an arithmetic and logic unit (ALU) or a combination thereof, which gives the controller 802 the computational capability to perform the techniques described herein.

The memory 804 may be a data storage device that is configured to store executable instructions that, when executed by the controller 802, cause the controller 802 to perform the techniques described herein. The memory 804 may be a read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, or solid state memory devices or a combination thereof.

The first communication device 806 may be a transceiver, modem or radio module that is configured to communicate with the tags 710, 712. The first communication device 806 is coupled to the controller 802. The first communication device 806 may transmit radio frequency (RF) signals to the tags 710, 712 and receive RF signals from the tags 710, 712. The first communication device 806 may additionally or alternatively communicate with the tags 710, 712 in accordance with a near field communications (NFC) protocol or a Bluetooth protocol.

The second communication device 808 may be a transceiver, modem or radio module. The second communication device 808 is coupled to the controller 124. The second communication device 808 may communicate in accordance with any protocol, such an Institute for Electrical and Electronics Engineers (IEEE) 802 protocol, a near field communications (NFC) protocol, a Bluetooth protocol or a combination thereof. The second communication device 808 may send data to the server indicating whether a tag 710, 712 or a device to which the tag 710, 712 is attached has been displaced.

In the event that a tag 710, 712 is a Bluetooth tag, the first communication device 806 receives, from the tag 710, 712, a signal that is transmitted in accordance with the Bluetooth protocol. The first communication device 806 may determine a magnitude or a power of the signal and output data representative of the magnitude or power to the controller 802. The controller 802 may receive the magnitude or power and determine a distance between the first communication device 806 (or set top box 800) based on the magnitude or power. For example, for a Bluetooth tag, a −10 decibel (dBm) power may correspond to a transmitter-to-receiver distance of 10 feet and a −20 dBm power may correspond to a distance of 20 feet. The signal power (also referred to as strength) indicates the distance between the set top box 800 and the tag 710, 712. The controller 802 may compare the signal power to a power threshold and determine whether the device associated with the tag 710, 712 has been displaced. The power threshold may, for example, be −15 dBm, and the controller 802 may determine that the device has been displaced if the power is less than −15 dBm. If the power is −15 dBm or greater, the controller 802 may determine that the device is not displaced.

Alternatively, the controller 802 may convert the power to distance and determine whether the device is displaced depending on distance. For example, the distance threshold may be 15 feet. The controller 802 may store a power-to-distance conversion table. The controller 802 may convert the received signal power to a distance and compare the distance to the threshold to determine whether the device is displaced. The controller 802 may use the second communication device 808 to communicate with the server. Depending on the outcome of the displacement determination, the controller 802 may use the second communication device 808 to send data to the server indicating whether the device has been displaced.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A displacement detection device, comprising:
a communication device;
a current sensor configured to:
    measure a current flowing through a wire to a device to
        determine a first current measurement and a second
        current measurement made before the first current measurement, the wire and the device being independent from the displacement detection device; and output data representative of the first current measurement and data representative of the second current measurement; and a controller that is separate from the current sensor and configured to:

receive the data representative of the first current measurement and the data representative of the second current measurement;

determine a threshold by at least:

determine that the second current measurement was made when the device that was being supplied with the power using the wire; and in response to determining that the second current measurement was made when the device was being supplied with the power using the wire, set the threshold to a value that is less than the second current measurement;

determine that the first current measurement is less than the threshold; and in response to determining that the first current measurement is less than the threshold, cause the communication device to transmit data to a server that is separate from the displacement detection device indicating that the device that was being supplied with power using the wire has been displaced.

2. The displacement detection device according to claim 1, wherein the controller is configured to:

receive, in each time interval of a plurality of time intervals, a respective current measurement of a plurality of current measurements;

for each current measurement of the plurality of current measurements, determine whether the current measurement exceeds the threshold; and in response to determining that the current measurement exceeds the threshold, cause the communication device to report to the server that the device is not displaced.

3. The displacement detection device according to claim 1, wherein the controller is configured to:

determine that the second current measurement is greater than 0 Amperes (A); and in response to determining that the second current measurement is greater than 0 A, determine that the second current measurement was made when the device that was being supplied with the power using the wire.

4. The displacement detection device according to claim 1, comprising:

a battery configured to supply the displacement detection device with power when the device is displaced.

5. The displacement detection device according to claim 1, wherein the controller is configured to:

wherein the controller receives data representative of the second current measurement by being configured to:

receive data representative of a plurality of second current measurements, the plurality of second current measurements including a first set of current measurements made when the device is operating in an active mode and a second set of current measurements made when the device is operating in a standby mode; and in response to determining that the second current measurement was made when the device was being supplied with the power using the wire:

identify the second set of current measurements out of the plurality of second current measurements; and set the threshold based on the second set of current measurements.

6. The displacement detection device according to claim 5, wherein the controller is configured to set the threshold based on a mean, median, mode or minimum of the second set of current measurements.

7. The displacement detection device according to claim 5, wherein the controller is configured to identify the second set of current measurements based on determining that the second set of current measurements form a cluster pertaining to the standby mode that is distinct from a cluster of the first set of current measurements.

8. The displacement detection device according to claim 1, comprising:

memory configured to store a factory preset threshold, wherein the controller is configured to:

prior to receiving data representative of the second current measurement that is made before the first current measurement, use the factory preset threshold as the threshold.

9. The displacement detection device according to claim 1, wherein the data indicating that that device has been displaced includes an identifier associated with the device.

10. A method, comprising:

measuring, by a displacement detection device, a current flowing through a wire to a device to determine a first current measurement, the wire and the device being independent from the displacement detection device;

obtaining, by the displacement detection device, a plurality of second current measurements, the plurality of second current measurements including a first set of current measurements made when the device is operating in an active mode and a second set of current measurements made when the device is operating in a standby mode;

identifying, by the displacement detection device, the second set of current measurements out of the plurality of second current measurements;

setting, by the displacement detection device, a threshold based on the second set of current measurements;

determining, by the displacement detection device, that the first current measurement is less than the threshold; and in response to determining that the first current measurement is less than the threshold, transmitting data from the displacement detection device to a server that is separate from the displacement detection device indicating that the device that was being supplied with power using the wire has been displaced.

11. The method according to claim 10, comprising:

setting the threshold based on a mean, median, mode or minimum of the second set of current measurements.

12. The method according to claim 10, comprising:

obtaining the plurality of second current measurements when the device is being supplied with power using the wire.

13. The method according to claim 12, comprising:

determining that the plurality of second current measurements are greater than 0 Amperes (A); and in response to determining that the plurality of second current measurements are greater than 0A, determining that the plurality of second current measurements were made when the device that was being supplied with the power using the wire.

14. The method according to claim 10, comprising:

identifying the second set of current measurements based on determining that the second set of current measurements form a cluster pertaining to the standby mode that is distinct from a cluster of the first set of current measurements.

15. A system, comprising:

a server; and a displacement detection device that is separate from the server and including:

memory configured to store a factory preset low threshold and a factory preset high threshold;

a communication device;

a current sensor configured to:

measure a current flowing through a wire to a device to determine a first current measurement and a second current measurement made before the first current measurement, the wire and the device being independent from the displacement detection device; and output data representative of the first current measurement and data representative of the second current measurement; and a controller that is separate from the current sensor and configured to:

prior to receiving the data representative of the second current measurement, use the factory preset low threshold as a low threshold and the factory preset high threshold as a high threshold;

after receiving the data representative of the second current measurement, use another low threshold determined based on the second current measurement as the low threshold, receive the data representative of the first current measurement;

determine that the first current measurement is at least one of less than the low threshold or higher than the high threshold; and in response to determining that the first current measurement is less than the low threshold or above the high threshold, cause the communication device to transmit data to the server indicating that there is a fault for the device that was being supplied with power using the wire.

16. The system according to claim 15, wherein the data indicating that that device has a fault includes an identifier associated with the device.

17. The system according to claim 15, wherein the controller is configured to:

receive, in each time interval of a plurality of time intervals, a respective current measurement of a plurality of current measurements;

for each current measurement of the plurality of current measurements, determine whether the current measurement exceeds the high threshold; and in response to determining that the current measurement exceeds the high threshold, cause the communication device to report to the server that the device has a fault.

\* \* \* \* \*